United States Patent [19]

Tokisue et al.

[11] Patent Number: 4,874,273
[45] Date of Patent: Oct. 17, 1989

[54] APPARATUS FOR HOLDING AND/OR CONVEYING ARTICLES BY FLUID

[75] Inventors: Hiromitsu Tokisue, Niihari; Nobuo Tsumaki, Ushiku; Toshifumi Koike, Niihari, all of Japan

[73] Assignee: Hitachi, Ltd., Tokyo, Japan

[21] Appl. No.: 155,808

[22] Filed: Feb. 16, 1988

[30] Foreign Application Priority Data

Mar. 16, 1987 [JP] Japan .................................. 62-58836
Mar. 16, 1987 [JP] Japan .................................. 62-58837

[51] Int. Cl.$^4$ ...................... B65G 51/03; B65G 47/24; B65G 51/16
[52] U.S. Cl. ...................................... 406/88; 406/89; 406/19; 406/86
[58] Field of Search ..................... 406/86–89, 406/10, 12, 19

[56] References Cited

U.S. PATENT DOCUMENTS

| | | | |
|---|---|---|---|
| 3,279,863 | 10/1966 | Bouladon et al. | 406/19 |
| 3,411,830 | 11/1968 | Smith | 406/88 |
| 3,477,764 | 11/1969 | Smith | 406/88 |
| 4,211,505 | 7/1980 | Babinski et al. | 406/19 |
| 4,371,309 | 2/1983 | Principe et al. | 406/19 X |
| 4,552,069 | 11/1985 | Jahn | 406/88 X |
| 4,618,292 | 10/1986 | Judge et al. | 406/19 |
| 4,622,918 | 11/1986 | Bok | 406/88 X |

FOREIGN PATENT DOCUMENTS

| | | | |
|---|---|---|---|
| 1076872 | 7/1967 | United Kingdom | 406/88 |
| 1207815 | 10/1970 | United Kingdom | 406/88 |
| 1390179 | 4/1975 | United Kingdom | 406/88 |

OTHER PUBLICATIONS

Gruber et al., IBM Tech. Disc. Bull, 18(6) 1975, pp. 1865–1866.
Perls et al., IBM Tech Disc. Bull., 19(11) 1977, pp. 4184–4185.

Primary Examiner—Joseph F. Peters, Jr.
Assistant Examiner—James M. Kannofsky
Attorney, Agent, or Firm—Antonelli, Terry & Wands

[57] ABSTRACT

An apparatus for holding or conveying an article to be held or conveyed by a fluid film having, in a holding surface or a delivery surface, fluid injection portions for supplying fluid at a low flow velocity to form the fluid film between the holding or conveying surface and the article to be held or conveyed.

10 Claims, 24 Drawing Sheets

F I G. 32
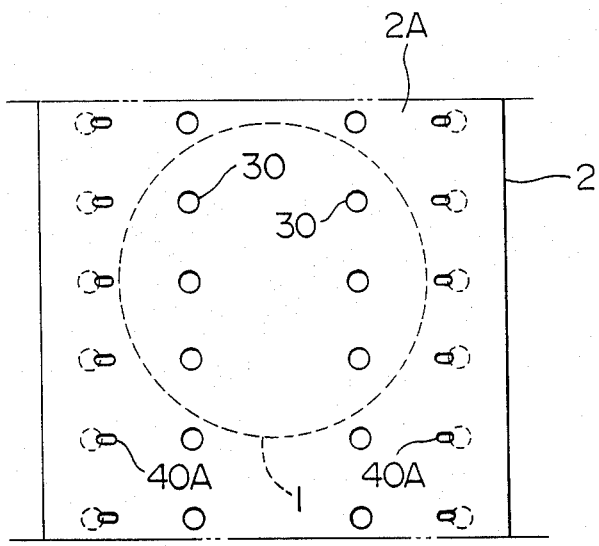
F I G. 33
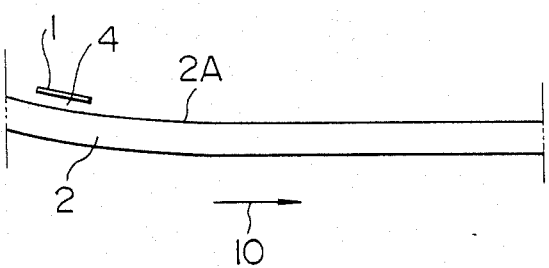

F I G. 47
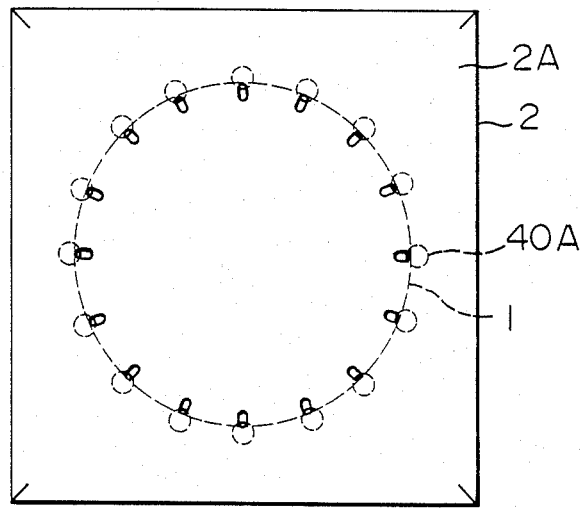
F I G. 48
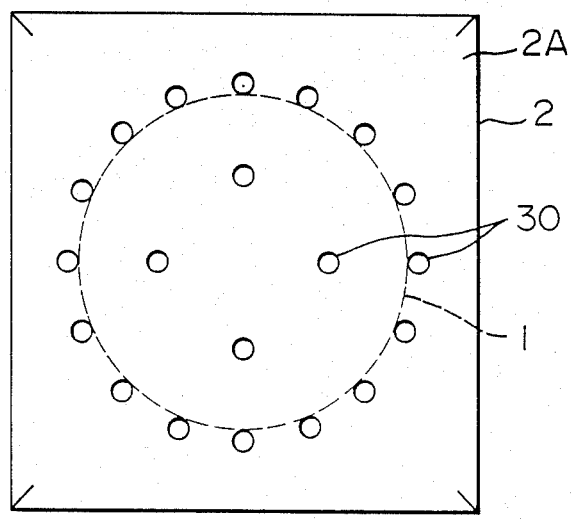

F I G. 49
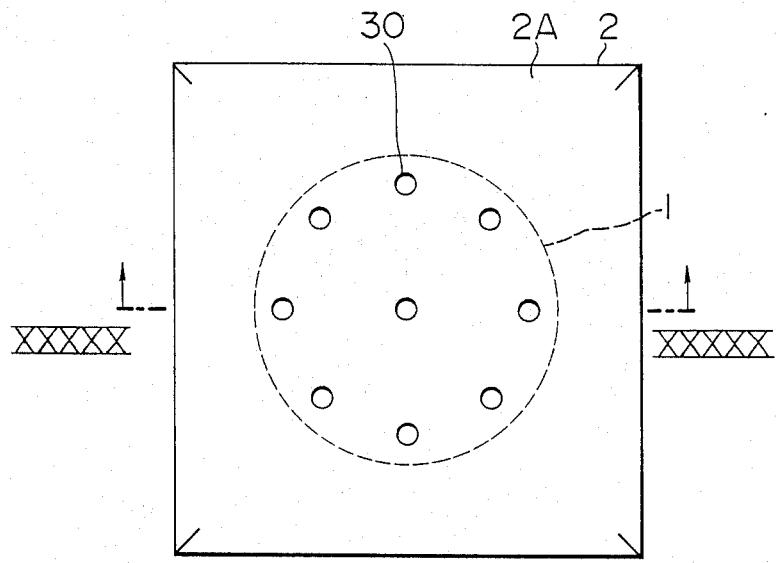
F I G. 50
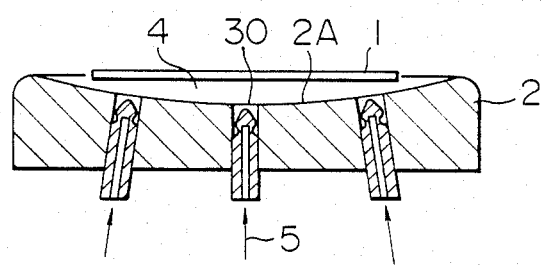

APPARATUS FOR HOLDING AND/OR CONVEYING ARTICLES BY FLUID

BACKGROUND OF THE INVENTION

1. Field of the Invention

The present invention relates to an apparatus for holding and/or conveying articles by fluid, and, more particularly, to an article holding and/or conveying apparatus for conveying articles such as semiconductor wafers and magnetic discs, which should be kept free from dust or foreign matter, floating on holding or conveying surfaces by fluid pressure under clean conditions.

2. Description of the Prior Art

A conveying apparatus for conveying articles under a clean condition is proposed in, for example, U.S. Pat. No. 4,211,505, wherein a first gas injection portion for supplying an air jet for floating the articles away from the conveyor surface and driving the articles in the delivery direction and a second gas injection portion for supplying air jet to impinge against peripheral edges of the opposite surfaces of the article are provided in a conveyor surface of a delivery path in order to prevent the articles moving on the delivery path from shifting in a direction perpendicular to the delivery direction and from falling apart from the delivery path.

Recently, there has been an increase in the demands for keeping clean the environment around the manufacture process as electronic parts become more fine with higher density. More specifically, it is one of the important tasks to be solved that the articles be conveyed under the condition that the surfaces of the articles be free from the dust. With respect to the demands, since the articles are delivered out of the contact with the conveyor according to the prior art, it would be possible to avoid the dust adhesion due to the contact of the delivery path. However, the air jets for floating, driving and guiding the articles cause the ambient dust to be entrained to form floating dust and, as a result, the dust adheres to the surfaces of the articles. Also, downward flows for preventing to prevent the floating dust contained in the ambient air from adhering to the article surfaces is turbulent so that the dust adhere to the article surfaces.

SUMMARY OF THE INVENTION

An object of the present invention is to provide an article holding and/or conveying apparatus for delivering articles under the condition that dust does not adhered to surfaces of the articles without any entrainment of ambient dusts or any turbulence of the downflow.

This and other objects of the present invention are attained by providing an article holding or conveying apparatus in which fluid films are formed between a delivery surface in a delivery path or a holding surface on a holder with articles to be conveyed, and the fluid films keeping the articles to be held or conveyed away from the holding surface or delivery surface, characterized by providing a fluid injection portion for supplying fluid at a low flow velocity for forming a fluid film between the holding surface or delivery surface and the articles to be held or conveyed.

Furthermore, the object of the invention is attained by providing, in the delivery surface, a fluid injection portion for supplying fluid at a low flow velocity for forming fluid films between the delivery surfaces and the articles to be delivered, detecting means for detecting positions of the articles to be delivered, flow rate adjusting means connected to the fluid injection portion, and controlling means for controlling the flow rate adjusting means in accordance with signals from the detecting means.

BRIEF DESCRIPTION OF THE DRAWINGS

In the accompanying drawings:

FIG. 32 is a plan view showing an apparatus in accordance with another embodiment of the invention;

FIG. 33 is a side elevational view of the apparatus shown in FIG. 32;

FIG. 47 is a plan view showing another embodiment of a holding device according to the invention;

FIG. 48 is a plan view showing of still another embodiment of a holding device according to the invention;

FIG. 49 is a plan view showing yet another embodiment of a holding device according to the invention;

FIG. 50 is a cross-sectional view taken along the line XXXXX—XXXXX of FIG. 49;

DESCRIPTION OF THE PREFERRED EMBODIMENTS

The present invention will now be described with reference to the accompanying drawings.

Figure 1:
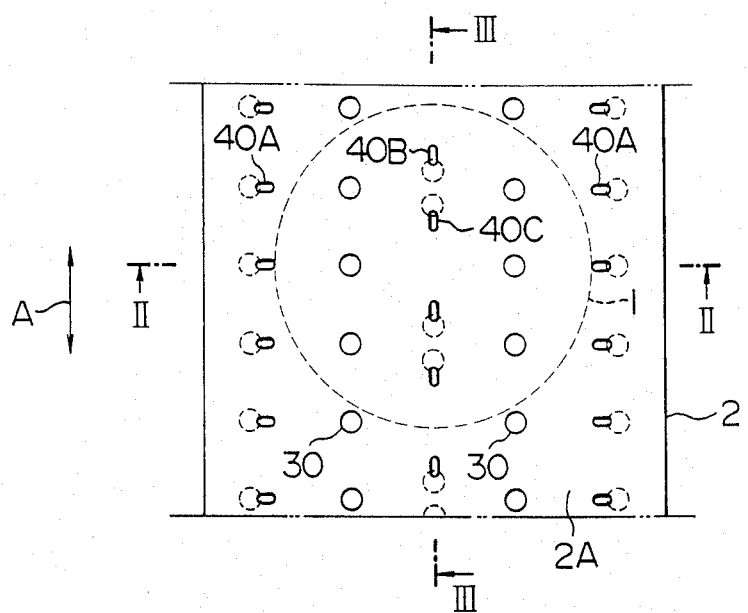
FIG. 1 is a plan view showing an apparatus according to one embodiment of the present invention.
Figure 2:
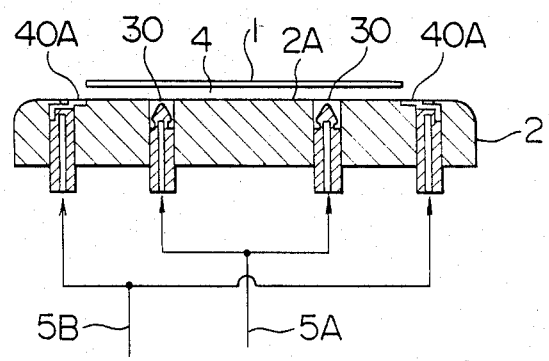
FIG. 2 is a cross-sectional view taken along the line II—II of FIG. 1.
Figure 3:
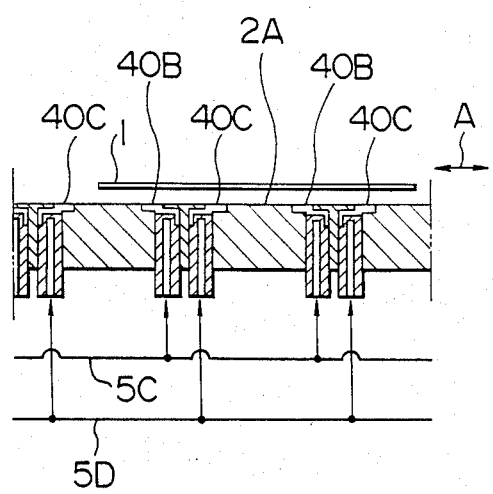
FIG. 3 is a cross-sectional view taken along the line III—III of FIG. 1.

Referring now to the drawings wherein like reference numerals are used throughout the various views to designate like parts and, more particularly, to FIGS. 1 to 3, according to these figures, an apparatus in accordance with the present invention includes a delivery or conveyor path 2 for conveying an article 1 to be delivered under a clean condition. In a delivery surface 2A of the deivery path 2, there are provided two kinds of gas injection portions, that is, a plurality of lifting or floating gas injection portions 30 for only applying lifting forces to the article to be delivered, in a direction vertical to the delivery surface 2A, and a plurality of driving gas injection portions 40A, 40B and 40C for applying drive forces to the article 1 in a direction parallel to the delivery surface 2A as well as the lifting or floating forces, in order to convey the article in a delivery direction indicated by an arrow A above the delivery surface 2A of the delivery path 2 under the condition that the article 1 is floatingly held by fluid while maintaining a gap 4 from the delivery surface 2A. Any one of these gas injection portions 30, 40A, 40B and 40C is constructed so that its injection gas is maintained at a low flow velocity while suppressing high speed flows. The above-described gas injection portion 30 for the lifting effect is connected to a pressurized gas source through a pipe 5A, with the gas injection portions 40A, 40B and 40C for the drive effect being respectively connected to the gas source through pipes 5B, 5C and 5D.

Figure 4:
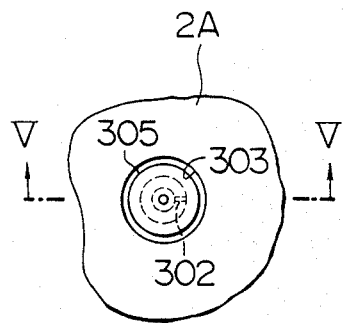
FIG. 4 is a plan view showing a detail of a gas injection portion for floating or lifting effects, used in the embodiment shown in FIG. 1.
Figure 5:
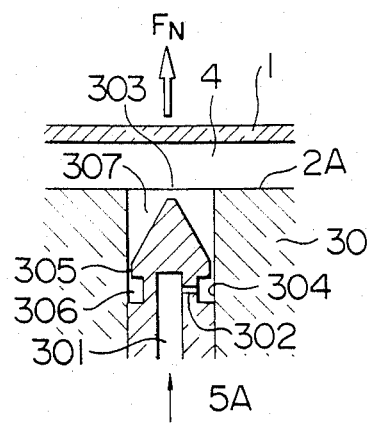
FIG. 5 is a cross-sectional view taken along the line V—V of FIG. 4.

As shown in FIGS. 4 and 5, each of the lifting effect gas injection portions has a pressurized gas supply path 301 in communication with the pressurized gas source, a small hole 302 extending perpendicular to the supply path 301 and maintained in communication therewith through a throttle effect, and an opening portion 303 opened to the delivery surface 2A for injecting the introduced air to the delivery surface 2A. In a portion between the opening portion 303 and the small hole 302, a first rectifying portion is composed of a wall surface 304 facing an outlet of the small hole 302 and spaced away from the outlet, and a second rectifying portion composed of a gap 305. A flow path 306 introduces the gas into the gap 305 and a flow path 307 communicates with the opening portion 303 at its outlet, in order to rectify the gas that has been introduced from the small hole 302, and to further rectify the gas flow to make uniform the flow velocity distribution at the gas injected from the opening portion 303 at the outlet of the opening portion 303. In this arrangement, it should be noted that the flow path 307 is a divergent path. In the flow path close to the opening portion 303, a flow path center axis of the opening portion 303 is directed in a direction substantially perpendicular to the delivery surface 2A, so that the fluid force of the gas injected from the opening portion 303 for acting against the article 1 to be floated above the opening portion 303 has only a lifting effect component in the direction perpendicular to the delivery path 2A.

Figure 6:
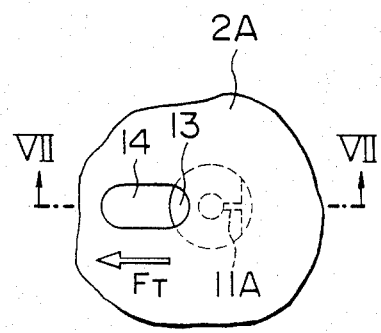
FIG. 6 is a plan view showing a detail of a gas injection portion or driving effects, used in the embodiment shown in FIG. 1.
Figure 7:
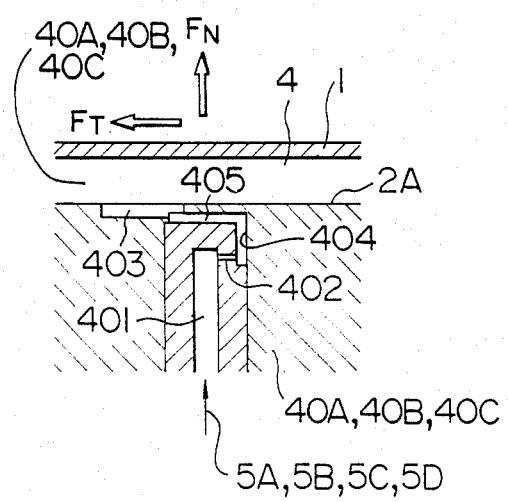
FIG. 7 is a cross-sectional view taken along the line VII—VII.

On the other hand, as shown in FIGS. 6 and 7, each of the drive effect gas injection portions 40A, 40B and 40C is provided with a pressurized gas supply path 401 maintained in communication with the pressurized gas source, a small hole 402 communicating with the supply path 401 and extending perpendicular to the supply path 401 with a throttle effect, and a groove-like opening portion 403 opened toward the delivery surface 2A. In a portion between the opening portion 403 and the small hole 402, a first rectifying portion for suppressing and rectifying a flow velocity of the gas supplied from the small hole 402 is composed of a wall surface 404 confronting with an outlet of the small hole 402 and spaced away from the outlet, and a second rectifying portion for further suppressing the flow velocity of the subsequent gas is composed of a flow path 405 in communication with the opening portion 403. The fluid pressure or force, applied to the article 1 to be floated above the opening portion 403, of the gas injected from the opening portion 403 has a drive effect component in a direction parallel to the delivery surface 2A as well as a lifting effect component in a direction vertical to the delivery surface 2A. In order to attain such a function with the outlet of the flow path 405 close to the opening portion 403, a flow path center axis of the opening portion 403 is directed obliquely relative to the vertical line of the delivery surface 2A. In this case, the drive force is applied to the article 1 to be delivered, in a direction indicated by an arrow FT, that is, in a direction slanted with respect to the vertical axis relative to the delivery surface 2A or in a direction of the opening portion 403 extending from the flow path 405. In any of the above-described lifting effect gas injection portions 30, and the drive effect gas injection portions 40A, 40B and 40C, its opening portion has an outlet area wider than a hole area of the small hole having the throttle effect. Namely, the opening portion 403 has the outlet area so that the throttle flow resistance of the opening portion 403 is smaller than a sum of the throttle flow resistance of the respective gas injection portions except for the opening area 403.

The arrangement of the above-described gas injection portions 30, 40A, 40B and 40C with respect to the delivery path 2 will be described with reference to FIGS. 1 to 3. Two rows of plural lifting effect gas injection portions 30 are provided along a longitudinal direction of the delivery path 2 in the delivery surface 2A of the delivery path 2. Disposed between the two rows of lifting effect gas injection portions 30 are rows of drive effect gas injection portions 40B and 40C whose drive forces have components directed to the longitudinal direction of the delivery path 2. Of these drive effect gas injection portions 40B and 40C, the gas injection portion 40B are arranged so as to have components of drive force directed upward in FIG. 1, whereas the gas injection portion 40C are arranged so as to have components of drive force directed downward in FIG. 1. In order to prevent the article 1 moving above the delivery surface 2A of the delivery path 2 from shifting in a direction perpendicular to the delivery direction A to fall apart from the delivery path, the gas injection portions 40A for the drive effect are provided in rows on the path edge sides so that the components of their drive forces are directed toward the central portion of the delivery surface 2A.

First of all, the operation of the gas injection portion 30 for the floating or lifting effect will be explained with reference to FIGS. 4 and 5. When the pressurized gas is supplied through the pipe 5A, the pressurized gas passes through the small hole 301 having the throttle effect to be injected in a jet flow from the small hole 301 and impinges against the wall surface 304. The gas passes through the gap 305 through the flow path 306 to reach the divergent flow path 307. Thereafter, the gas is introduced from the opening portion 303 into the gap 4 between the delivery surface 2A and the article 1 to be delivered. Thus, the space between the delivery surface 2A and the article 1 is maintained under a gas lubrication condition.

The small hole 302 functions to constantly maintain the space of the gap 4 between the delivery surface 2A and the article 1. Namely, when the space of the gap 4 is decreased, the amount of the gas flowing through the small hole 302 is decreased. The outlet pressure at the small hole 302 is increased due to the fact that the small hole 302 has the throttle effect, so that the pressure within the gap 4 will be increased. Inversely, when the space of the gap 4 is increased, the pressure within the gap 4 will be described due to the reverse phenomenon. The change in pressure of the gap 4 has a positive "rigidity" against the change of the gap 4, so that the space of the gap 4 may be kept constant against a predetermined load.

The wall surface 304 constituting the first flow rectifying portion serves to rectify the gas flow introduced through the small hole in order to prevent the generation of turbulence or injection as described before, and to make substantially uniform the flow velocity distribution of the gas injected from the opening portion 303 at the opening portion outlet. In other words, although the pressurized gas passed through the small hole 302 has been inejcted in a jet flow, the jet flow is impinged against the wall surface 304 formed in a confronted manner with the outlet of the small hole 302 so as to break the jet flow. Thereafter, the pressurized gas is distributed uniformly over the gap 305 through the flow path 306 constituting the second flow rectifying portion, and is introduced substantially uniformly into the flow path 307 through the gap 305. In the flow path 307, during the passage of the pressurized gas through the flow path 307, the viscous diffusion effect of the gas causes the difference in the flow velocity distribution to become uniform. Also, in this case, since the flow path is of the divergent type, the pressurized gas introduced into the flow path 307 is decelerated with a substantially uniform flow velocity distribution, and is injected from the opening portion 303. In this case, since the opening portion 303 is formed so as to have a wider outlet area than the hole area of the small hole 302, the flow velocity of the air at the opening portion 303 is small in comparison with the injection velocity from the small hole 302. It is possible to sufficiently decrease the flow velocity at the opening portion 303 while keeping the necessary gas flow velocity for the lifting, by sufficiently enlarging the outlet area of the opening portion 303. Also, although FIG. 5 shows the article 1 to be floatingly conveyed above the opening portion, the above-described suppressing effect of the injection flow is maintained unchanged even if there is no article 1 located above the opening portion 303. In other words, the suppressing effect of the injection flow is available in the case when no article 1 is provided above the opening portion 1. More specifically, due to the fact that the flow velocity of the gas injected from the opening portion 303 is low, there is no fear that the dust on the delivery surface 2A would be entrained into the injection gas so as to adhere to the surfaces of the article 1. Also, due to the fact that the injection flow velocity is low, in the same manner, there is no fear that the downward flow would be disturbed, and hence there is no turbulence of the air flow, along the surfaces of the article 1, formed on the surfaces of the article 1 by the downward flow. Therefore, the floating dust contained in the ambient space would not adhere to the surfaces of the article 1.

The fluid pressure to be applied to the article 1 will be explained. The flow path in the vicinity of the opening portion 303 is formed so that the direction of the flow path center axis is directed in the direction substantially vertical to the delivery surface. Therefore, the gas injected into the gap 4 from the opening portion 303 will flow uniformly around the opening portion 303 within the gap 4, the article 1 to be floated above the opening portion 303 is subjected only to the lifting effect force in the vertical direction to the delivery surface 2A.

The operation of the gas injection portions 40A, 40B and 40C for the drive effect will now be described with reference to FIGS. 6 and 7. When the pressurized gas is supplied through the pipes 5A, 5B, 5C and 5D, the pressurized gas passes through the small hole 402 having the throttle effect to be injected in a jet flow by the small hole 402. After the passage of the gas through the flow path 405, the gas is introduced into the gap 4 between the delivery surface 2A and the article 1, thereby keeping the space between the delivery surface 2A and the article 1 under a gas lubrication condition.

The effect and operation of the small hole 402 are the same as those of the gas injection portion 30 for the lifting effect, and the small hole 402 serves to keep constant the space of the gap 4 between the delivery surface 2A and the article 1.

The rectifying portions for suppressing the injection flow are also substantially the same as described before. The jet flow injected from the small hole 402 is impinged against the wall surface 404 constituting the first rectifying portion, to be broken. Subsequently, during the passage through the flow path 405 constituting the second rectifying portion, the difference in flow velocity of flow directions are eliminated by the viscous diffusion effect of the gas, so that the gas is discharged from the opening portion 403 with substantially uniform flow discharge rate distribution. Since the outlet area of the opening portion 403 is larger than the hole area of the small hole 402, the discharge flow velocity of the gas from the opening portion 403 is smaller than the injection flow velocity from the small hole 402. Thus, in the same manner as the case of the gas injection portion 30 for the lifting effect, the dust does not adhere to the surfaces of the article 1.

The fluid forces applied to the article 1 by the injection portions 40A to 40C will be explained. In the flow path 405 in the vicinity of the opening portion 403, the flow path center axis is slanted relative to the vertical axis of the delivery surface 2A, so that the gas introduced into the gap 4 from the opening portion 403 will flow mainly in a direction in which the flow path center axis is slanted, i.e., toward the left side in FIGS. 6 and 7. As a result, the force is applied to the article in a direction indicated by the arrow Ft by the viscous effect of the gas. Also, since the opening portion 403 is provided in the delivery surface 2A so that the opening portion 403 is constituted by a groove opened toward the flow path 405 at one end and closed at the other end, the gas discharged from the opening portion 403 will flow to gather into the groove where the resistance is small. Thereafter, since the gas flows in the left in FIGS. 6 and 7, the drive force is also generated in the direction indicated by the arrow Ft in addition to the above-described drive forces, in the gas injection portions 40A, 40B and 40C for the drive effect, the gas lubrication effect of the gas discharged from the opening portion 403 causes the lifting effect force to be generated in the vertical direction relative to the delivery surface 2A.

The operation of the delivery path 2 in which the gas injection portions 30, 40A to 40C are arranged will be described with reference to FIGS. 1, 2 and 3. When the pressurized gas is supplied to the pipe 5A shown in FIG. 2, the article 1 floats above the delivery surface 2A by the injection effect of the low flow velocity fluid from the two rows of the floating gas injection portions 30. When the pressurized gas is supplied to the pipe 5B, the two rows of the drive gas injection portions 40A provided on both path edge sides of the delivery path 2A is adapted to effect the injection at a low flow velocity so as to maintain the article 1 at a position between the two rows of the drive gas injection portion 40A along both the path edge sides. Namely, when the article 1 is shifted in the direction perpendicular to the delivery direction A so tht an edge portion of the lower surface of the article 1 is moved above the drive gas injection portion 40A on one side, the drive force is applied to the article 1 toward the center of the delivery surface 2A, and the article 1 is immediately returned back to the central position of the delivery surface 2A. Thus, when the article 1 floats above the delivery surface 2A under the condition that the article 1 is guided within the delivery surface 2A, and the pressurized gas is supplied to the pipe 5D shown in FIG. 3, the drive force in the downward direction in FIG. 1, i.e., rightward direction in FIG. 3 is applied to the article 1 by the effect of the low flow velocity injection fluid from the gas injection portion 40C for the drive effect. If the article 1 is at a standstill, the drive force causes the article 1 to be accelerated and delivered in the downward direction in FIG. 1. If the article 1 is being moved in the upward direction in FIG. 1, the article 1 is decelerated to eventually stop. When the supply of the pressurized gas to the pipe 5D is stopped and the pressurized gas is supplied to the pipe 5C, the drive force in the upward direction in FIG. 1, that is, leftward direction in FIG. 3 is applied to the article 1 by the effect of the low flow velocity injection fluid from the gas injection portion 40B for the drive effect. Namely, by the action of the low flow velocity injection fluids from the drive gas injection portions 40B and 40C, the article 1 may be delivered in both the direction in the longitudinal direction of the delivery path 2, and it is possible to freely adjust the delivery speed of the article 1 in either of the delivery direction as desired. In the foregoing embodiment, since the article 1 to be delivered is conveyed under the complete non-contact condition, there is no dust adhesion to the article 1 due to the contact. Also, since the collision force would not be transmitted to the article 1, there is no fear that the article would be damaged or the dust would be generated from the article 1.

In the above-described embodiment of the invention, since the ambient dust entrainment or turbulence in the downward flow would not be caused, it is possible to deliver the article under the condition that the surface of the article 1 is free from the dust. Also, since the article is delivered under the complete non-contact condition, there is no risk that the dust will adhere to the article due to the contact, and the article would be damaged and the dusts would be generated from the article.

Figure 8:
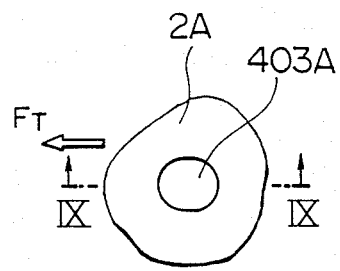
FIG. 8 is a plan view illustrating an example of a floating gas injection portion in an apparatus according to the present invention.
Figure 9:
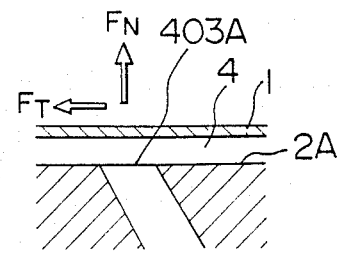
FIG. 9 is a cross-section view taken along the line X—10 of FIG. 8.
Figure 10:
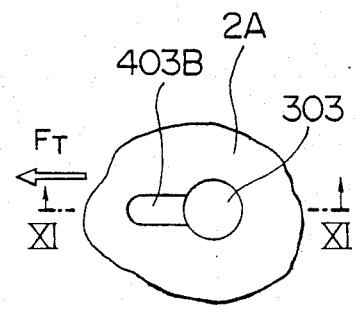
FIG. 10 is a plan view illustrating another example of the driving gas injection.
Figure 11:
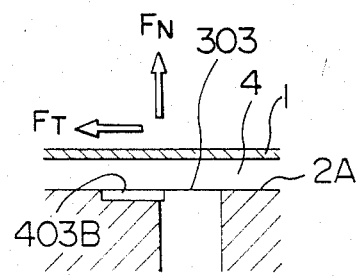
FIG. 11 is a cross-sectional view taken along the line XI—11 of FIG. 10.

The floating gas injection portion 30 shown in FIGS. 4 and 5 is so constructed that the direction of the flow path center axis in the opening portion 303 is perpendicular to the delivery surface 2A. However, it is possible to modify the construction as follows. As shown in FIGS. 8 and 9, the direction of the flow path center axis of the opening portion 403A is slanted relative to the vertical axis of the delivery surface 2A. Also, as shown in FIGS. 10 and 11, the groove-like opening portion, 403B is formed so that one end portion formed in the delivery surface 2A, is opened to the opening portion 303, and the other end portion is clsed. Otherwise, these types of injection portions are combined with each other to form the drive arrangement.

Different from the foregoing modifications, it is possible to form the drive gas injection portions 40A to 40C, shown in FIGS. 6 and 7, into the lifting injection portions.

Figure 12:
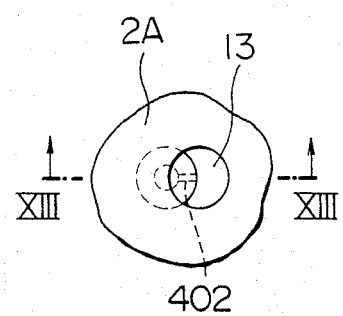
FIG. 12 is a plan view of another embodiment of the present invention.
Figure 13:
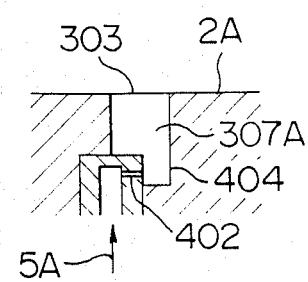
FIG. 13 is a cross-sectional view taken along the line XIII—13 of FIG. 12.

FIGS. 12 and 13 show an arrangement in which the resistance portion is constituted by a small hole 402 having the throttle effect, a wall surface 404 is used as a first rectifying portion, and a flow path 307A is used as a second rectifying portion.

In this embodiment, since the resistance portion is formed by the small hole 402, the estimation of the throttle effect is facilitated and the calculation may readily be performed.

Figure 14:
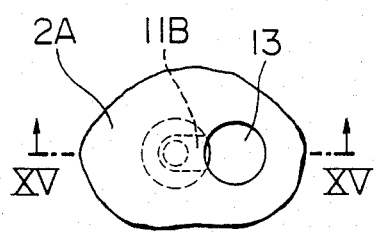
FIG. 14 is a plan view of another embodiment of the present invention.
Figure 15:
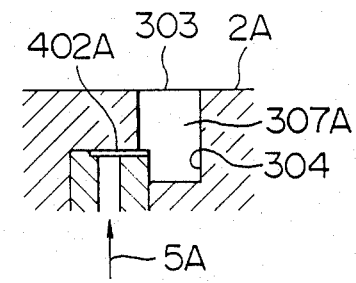
FIG. 15 is a cross-sectional view taken along the line XV—15 of FIG. 14.

FIGS. 14 and 15 show an arrangement in which the small hole 402 of the modification shown in FIGS. 12 and 13 is replaced by a fine gap 402A having the throttle effect.

In this arrangement, since the resistance portion is constituted by the fine gap 402A, the injection flow from the fine gap 402A is diffused and is quickly damped, so that it is easy to control the rectification.

Figure 16:
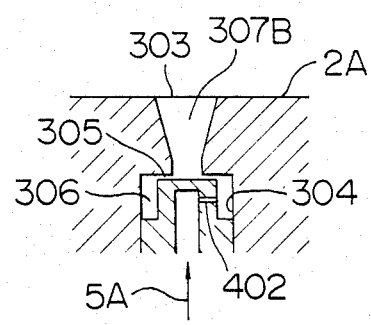
FIG. 16 is a view showing still another embodiment of the present invention.

FIG. 16 shows an arrangement in which the second rectifying portion is provided with the gap 305, a flow path 306 for introducing the gas into the gap 305 and a radially divergent flow path 307B. In this embodiment, since the flow out direction of the injection gas from the gap 305 is different from the direction of the flow path downstream of the gap 305, it is possible to ensure the higher rectifying effect.

Figure 17:
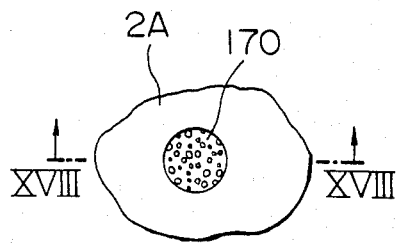
FIG. 17 is a plan view showing another embodiment of the present invention.
Figure 18:
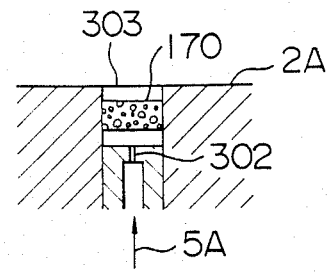
FIG. 18 is a cross-sectional view taken along the line XVIII—18 of FIG. 17.

FIGS. 17 and 18 show a case where the rectifying portion is formed of gas permeable member 170 made of porous material.

In this embodiment, since the gas is uniformuly discharged from the porous material, the high rectifying effect is insured.

Figure 19:
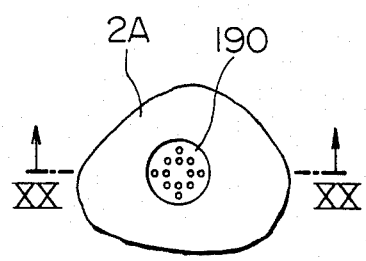
FIG. 19 is a plan view showing a still further embodiment of the present invention.
Figure 20:
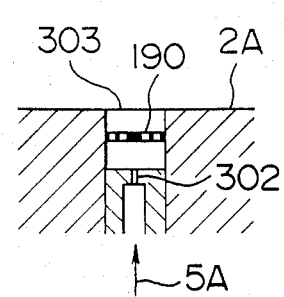
FIG. 20 is a cross-sectional view taken along the line XX—20 of FIG. 19.

FIGS. 19 and 20 show a case where the rectifying portion is formed of a gas permable member 190 made of a porous plate.

In this embodiment, there is an advantage that, by changing locations of the pores of the porous plate and diameters of the pores, it is possible to design the flow velocity distribution of the gas from the opening portion 303, as described.

Figure 21:
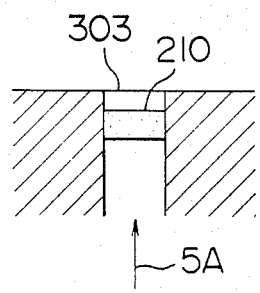
FIG. 21 is a cross-sectional view of a further embodiment of the present invention.

FIG. 21 shows a case where the resistance portion is formed of a gas permeable member 210 having the throttle effect, and the permeable member 210 serves also as the rectifying portion.

In this embodiment, since the resistance portion and the rectifying portion are made of the single member, the structure may be simplified.

Figure 22:
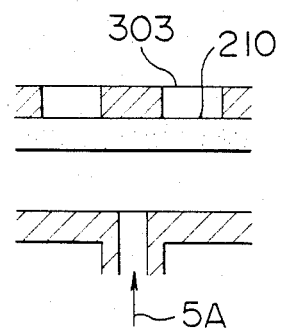
FIG. 22 is a cross-sectional view showing yet another embodiment of the present invention.

FIG. 22 shows a case where the resistance portion is formed of a gas permeable member 210 having the throttle effect, the permeable member 210 serves also as the rectifying portion, and a plurality of opening portions 303 are provided in the resistance portion of the permeable member 210.

According to this embodiment, since the number of manufacturing steps for machining and shaping of the gas permeable material which is difficult to work with a high precision may be reduced, it is easy to perform the manufacture.

Figure 23:
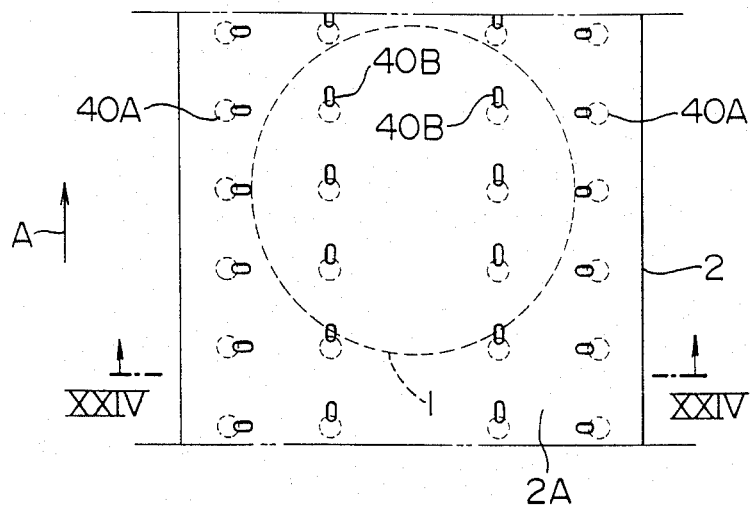
FIG. 23 is a plan view showing an apparatus in accordance with another embodiment of the present invention.
Figure 24:
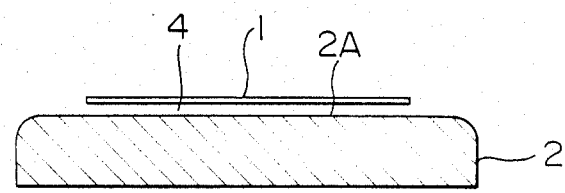
FIG. 24 is a cross-sectional view taken along the line XXIV—XXIV of FIG. 23.

In the embodiment of FIGS. 23 and 24, the drive effect gas injection portion 40B is formed in the delivery surface 2A of the delivery path 2, so that the drive forces are all directed in one direction of the longitudinal direction of the delivery path 2, and gas injection portion 40A for the drive effect for guidance are provided along both edge sides of the delivery surface 2A.

In accordance with this embodiment, since the article 1 is subjected to both the lifting force and the drive force in the delivery direction only by the drive gas injection portions, it is possible to ensure a complete non-contact delivery with a relatively simple arrangement.

Figure 25:
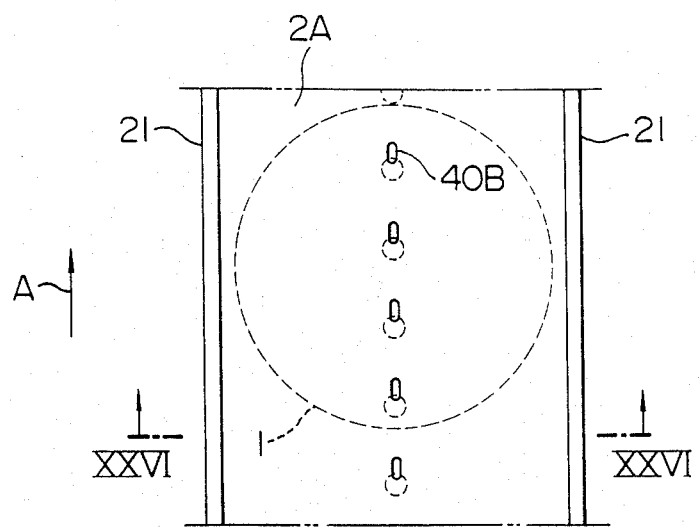
FIG. 25 is a plan view showing an apparatus in accordance with another embodiment of the invention.
Figure 26:
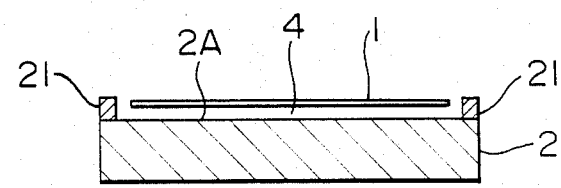
FIG. 26 is a cross-sectional view taken along the line XXVI—XXVI of FIG. 25.

In the embodiment of FIGS. 25 and 26, the gas injection portions 40B for the drive effect are formed in the delivery surface 2A so that the drive forces of the drive effect have all the components directed in one direction of the longitudinal direction of the delivery path 2, and guides 21 of stationary walls are provided on both edge sides of the delivery path 2.

In this embodiment, since the structure is simple, the manufacture is also simplified. Also, the number of the gas injection portions may be reduced, so that the amount of gas to be consumed may be reduced. Since the guides 21 are the stationary walls, even if the outside turbulent force is applied to the article 1, there is no fear that the article 1 falls away from the delivery path 2.

Figure 27:
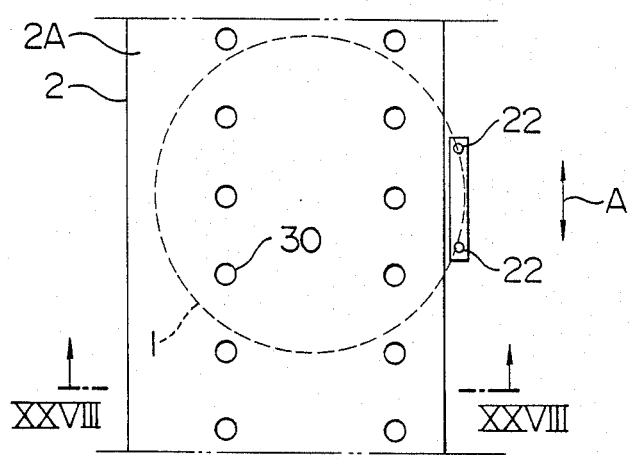
FIG. 27 is a plan view showing an apparatus in accordance with still another embodiment of the invention.
Figure 28:
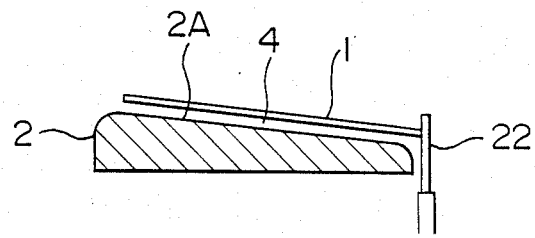
FIG. 28 is a cross-sectional view taken along the line XXVII—XXVII of FIG. 27.

In the embodiment of FIGS. 27 and 28, the gas injection portions 30 for the lifting effect are formed in the delivery surface 2A, and the conveying member 22 is in contact with a part of the article 1 for applying the force to the article 1 in the delivery direction A in order to float the article above the delivery surface 2A in the delivery direction. In this case, in order to ensure the force for depressing the article against the conveying member 22, the delivery surface 2A is slanted in a direction perpendicular to the longitudinal direction of the delivery path 2.

According to the present invention, the article 1 is moved together with the conveying member 22. Therefore, it is possible to deliver the article 1 without fail, and it is possible to perform the stopping and holding of the article 1 as desired.

Figure 29:
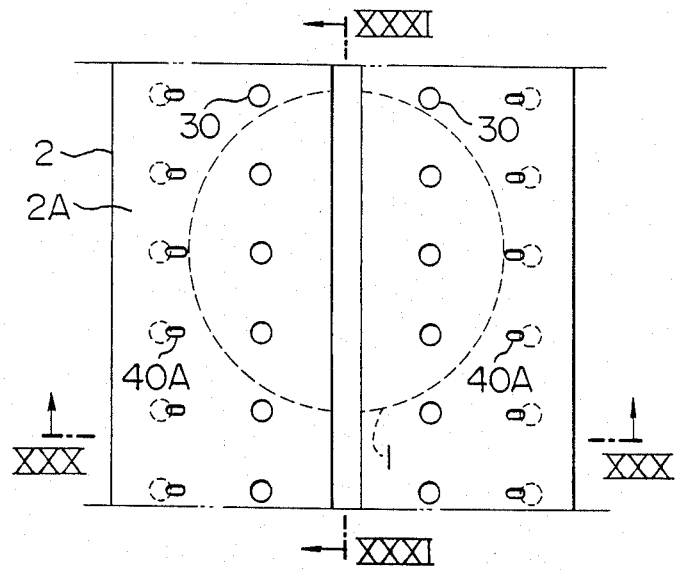
FIG. 29 is a plan view showing an apparatus in accordance with another embodiment of the invention.
Figure 30:
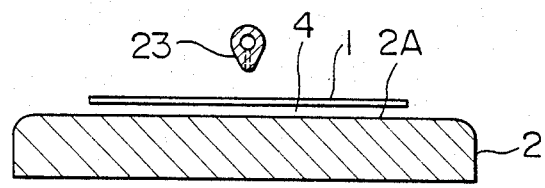
FIG. 30 is a cross-sectional view taken along the line XXX—XXX of FIG. 29.
Figure 31:
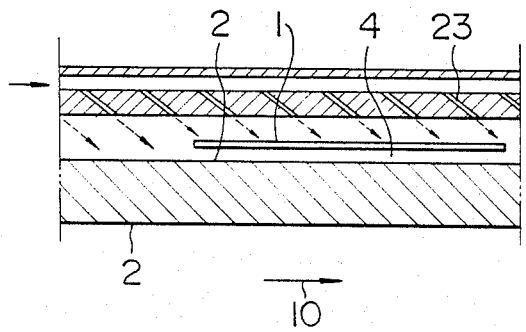
FIG. 31 is a cross-sectional view taken along the line XXXI—XXXI of FIG. 29.

In the embodiment of FIGS. 29-31, the lifting gas injection portions 30 and the guide drive gas injection portions 40A are formed in the delivery path 2A. Further, in order to drive the article 1 in the delivery direction 10, small holes 23 for injecting jet flows of gas are provided at positions where the jet flows are applied to the article 1. In this case, the jet flows from the small holes 23 are injected from above the article 1 toward the top surface of the article 1.

In this embodiment, the mechanism for driving the article in the delivery direction 10 in non-contact relation is composed of the small holes 23 for injecting the jet flows. Thus, the manufacture is easy. The downward jet flow is effective to suppress the generation of the turbulence of the down flow or entrainment of dusts in comparison with the upward jet injection.

In the embodiment of FIGS. 32 and 33, the floating gas injection portions 30 and the drive gas injection protions 40A for guiding are formed in th delivery surface 2A. In order to drive the article 1 in the delivery direction A, the delivery surface 2A of the delivery path 2 is slanted relative to the longitudinal direction so that the delivery surface 2A is located at a low level in the delivery direction 10.

According to this embodiment, it is unnecessary to provide any special delivery direction drive mechanism, thereby simplifying the structure.

Figure 34:
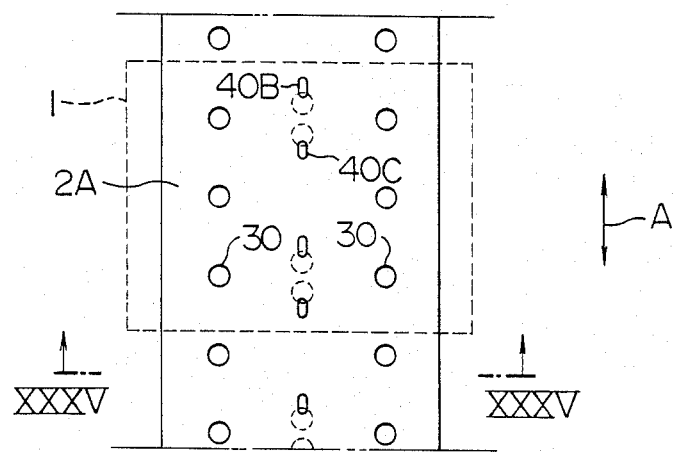
FIG. 34 is a plan view showing an apparatus in accordance with still another embodiment of the invention.
Figure 35:
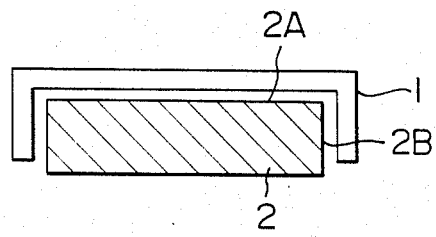
FIG. 35 is a cross-sectional view taken along the line XXXV—XXXV of FIG. 34.
Figure 36:
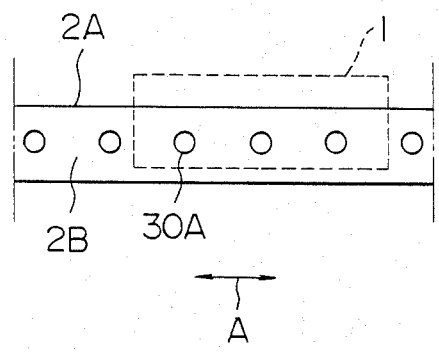
FIG. 36 is a side elevational view showing the apparatus shown in FIG. 34.

In this embodiment of FIGS. 34 to 36, the floating effect gas injection portions 30 and the drive effect gas injection portions 40B and 40C for driving the article 1 in the delivery directions A are formed in the delivery surface 2A, and in order to prevent the article 1 from falling down from the delivery path 2, wall surfaces 2B which are not in parallel with the delivery path 2 are formed in the delivery direction A on the sides of the delivery path 2A with the lifting effect gas injection portions 30A being formed in the wall surfaces 2B. In this case, the article 1 to be delivered might be considered as a carriage for carrying thereon a substance.

In this embodiment, since there are provided guide wall surfaces 2B having the gas injection portions 30A, it is possible to guide the article 1 in a non-contact state without fail.

Figure 37:
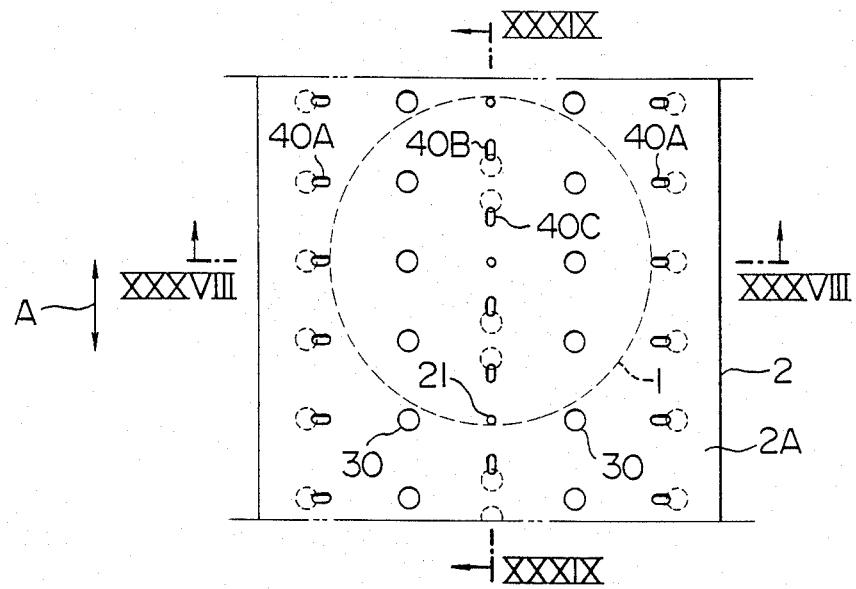
FIG. 37 is a plan view showing still another embodiment of the invention.
Figure 38:
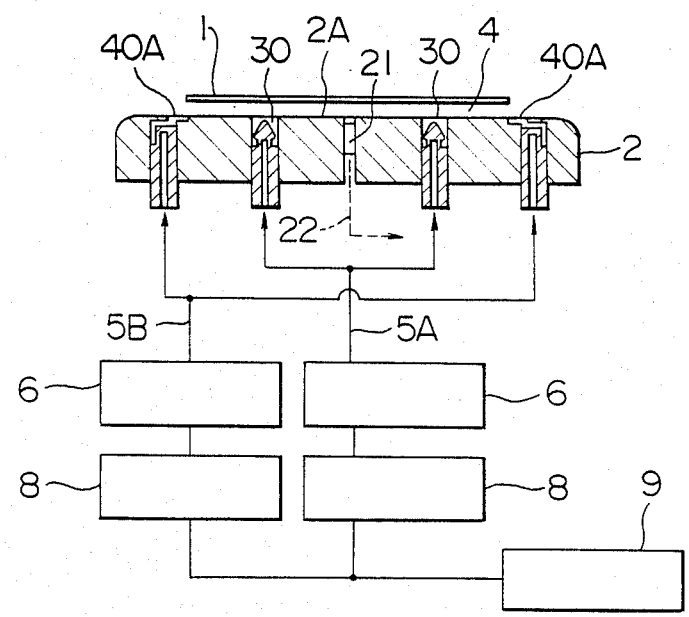
FIG. 38 is a cross-sectional view taken along the line XXXVIII—XXXVIII of FIG. 37.
Figure 39:
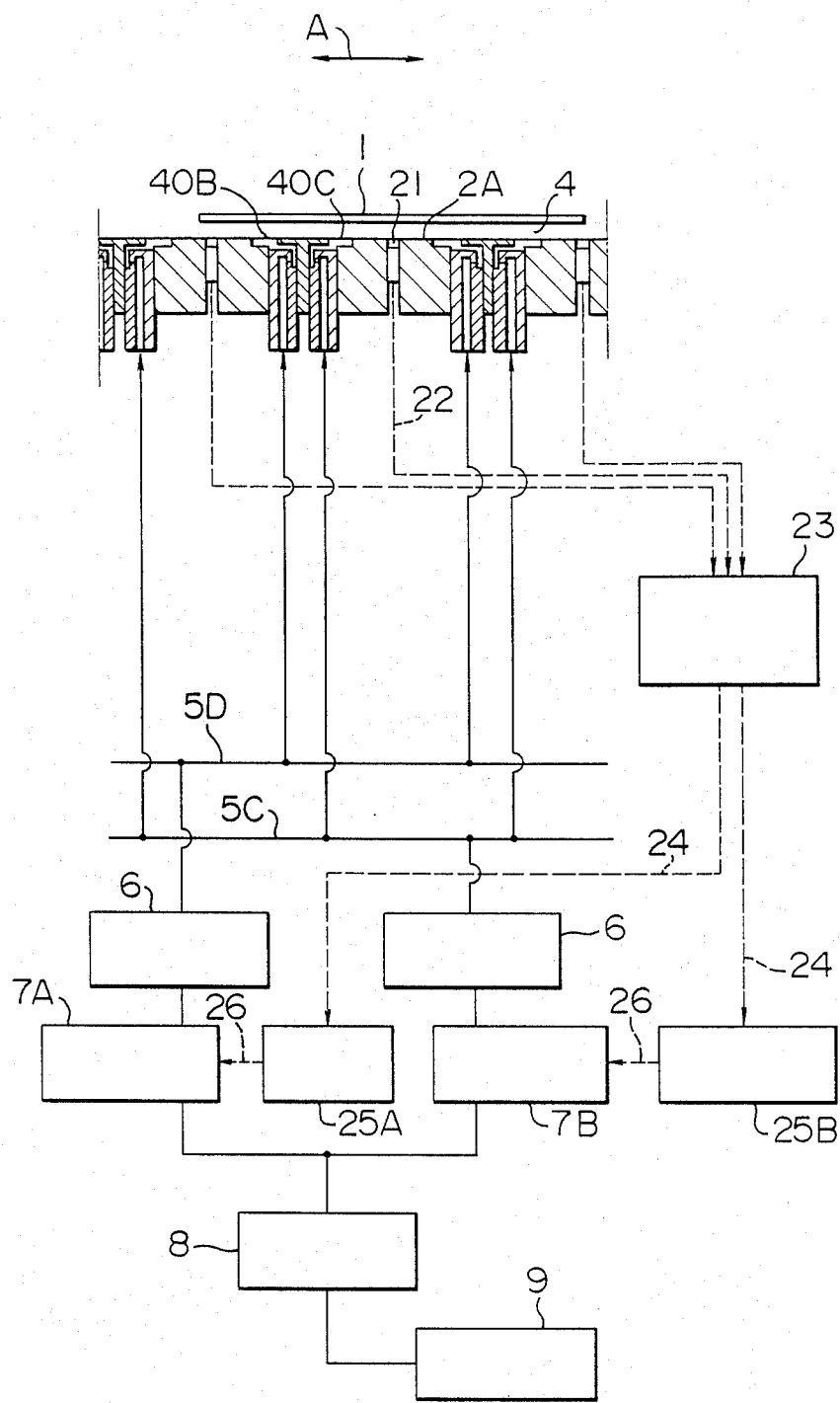
FIG. 39 is a cross-sectional view taken along the line XXXIX—XXXIX of FIG. 37.

As shown in FIGS. 37 to 39, a number of lifting effect gas injection portions 30 and drive effect gas injection portion 40A to 40C are formed in a delivery surface 2A of the delivery path 2. The article 1 is conveyed in a direction indicated by the arrow A on the delivery surface 2A of the delivery path 2 under the condition that the article 1 be floated by gas with a gap or space 4. Position detecting means for detecting the postion of the article on the delivery path 2, such as photoelectric switches 21, are arranged in a single row along the longitudinal direction of the delivery path 2. The lifting effect gas injection portions 30 are in communication with a pressurized gas source 9 through an air filter 6 and a pressure regulator 8 by pipings 5A. Also, the drive effect gas injectiin portions 40A provided along both sides of the delivery surface 2A are in communication with the pressurized gas source 9 through an air filter 6 and a pressure regulator 8 by pipings 5B. Further, respective pipings 5D and 5C for introducing the pressurized gas from the pressurized gas source 9 into the gas injection portions 40B and 40C are in communication with the pressurized gas source 9 through filters 6, through valve units 7A and 7B such as flow rate varying units for changing flow rates of the gas injected from the gas injection portions 40B and 40C, and through a regulator 8. The valve units 7A and 7B are so constructed that the valve units 7A and 7B may be controlled by controller 23 and drivers 25A and 25B in response to signals from the photoelectric switches 21.

When the pressurized gas is supplied from the pressurized gas source 9 to the piping 5A, the two rows of floating effect gas injection portions 30 provide the low velocity injection fluid to lift the article 1 above the delivery surface 2A. Then, when the pressurized gas is supplied from the pressurized gas source 9 to the piping 5B, the two rows of drive effect gas injection portions 40A provided on both sides of the delivery surface 2A cause the article 1 to be located between the rows of the drive effect gas injection portions 40A on both sides of the delivery path. Namely, when the article 1 is shifted perpendicularly to the delivery direction A with its lower end portion being located above the row of the drive effect gas injection portions 40A, the drive forces are applied to the article toward the centerline of the delivery surface 2A, so that the article 1 is immediately returned back to the central portion of the delivery surface 2A.

Thus, when the valve unit 7B is opened under the condition that the article 1 is floated above the delivery surface 2A and is guided within the delivery surface 2A, the pressurized gas is introduced from the pressurized gas source 9 into the piping 5C. As a result of the effect of the drive effect gas injection portions 40C, the drive forces are applied to the article 1 in the downward direction in FIG. 1, that is, in the rightward direction in FIG. 3. If the article 1 is first stopped, the article 1 is accelerated and delivered in the downward direction in FIG. 1 by the drive forces. Also, when the article 1 is being moved in the upward direction in FIG. 1, the article is decelerated and will stop sometime. Also, when the valve unit 7B is closed to stop the supply of the pressurized gas to the piping 5C and the valve unit 7A is opened, the pressurized gas is supplied to the piping 5D. As a result, the gas injection portions 40B for the drive effect cause their drive forces to shift the article 1 in the upward direction in FIG. 1 and in the liftward direction in FIG. 3. To sum up, by opening and closing the valve units 7B and 7A, it is possible to deliver the article 1 in both directions of the longitudinal direction of the delivery path 2 by the action of the drive effect gas injection portions 40B and 40C. Also, it is possible to accelerate or decelerate the delivery speed of the article 1 in either of the delivery directions as desired.

When the article 1 is thus moved in the delivery direction above the delivery surface 2A, the article 1 passes over the photoelectric switches 21 provided in the delivery surface 2A. The photoelectric switches 21 may detect the existence or non existence of the article in the detection directions, to thereby output On/Off signals representative of the existence or non-existence. For example, in the case where there is no article 1 over the photoelectric switches 21, the Off signal is issued, and in the case where there is the article thereover, the On signal is issued. In this case, the photoelectric switches that have been changed from the output signals On to the signals Off may be known to thereby detect the position of the article 1 at this time.

As described above, in this embodiment, it is possible to detect the position of the article 1 above the delivery path 2 by the photoelectric switches 21, and it is possible to accelerate and decelerate the delivey speed of the article 1 by the valve units 7A and 7B as desired. Therefore, it is possible to control the delivery speed in response to the position of the article 1, and thus it is possible to perform a branch delivery without collision, a curved delivery without collision and smooth stopping of the article 1.

Figure 40:
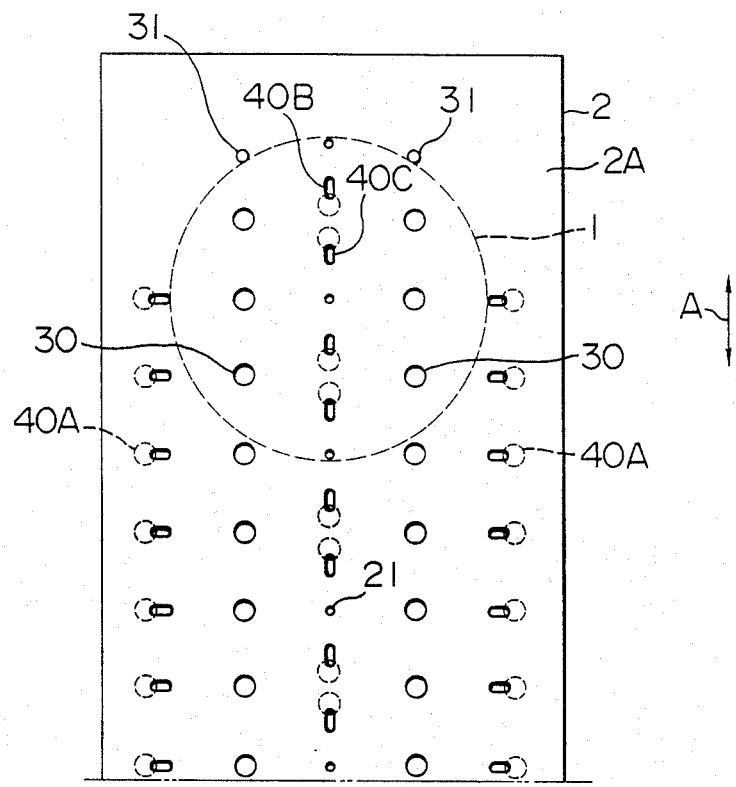
FIG. 40 is a plan view showing an apparatus according to another embodiment of the invention.
Figure 41:
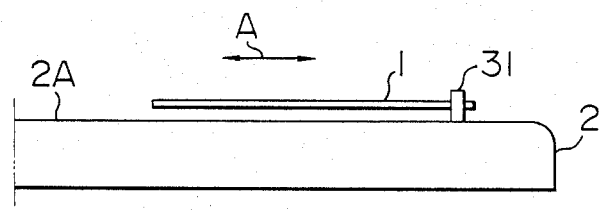
FIG. 41 is a transverse sectional view of the apparatus shown in FIG. 40.

For example, in the case where it is desired to stop the moving article 1 in abutment with a stop 31 as shown in FIGS. 40 and 41, the delivery speed is controlled so that the deceleration is started before the stop position and the speed becomes zero at the stop position whereby it is possible to stop the article 1 at a desired position without any shock.

The control of the delivery speed, particularly for the speed deceleration, is performed by governing time periods of opening of the valve units 7A and 7B when the valve units 7A and 7B are of the On/Off type. Also, in the case where the valve units 7A and 7B are of the continuously variable flow rate type, the control of the delivery speed is performed by governing the valve opening time periods as well as the flow rates. Alternatively, it is possible to calculate the delivery speed in accordance with the positional information from the photoelectric switch 21 provided in a row. In this case, it is possible to perform more suitable control by the delivery speed as well as the positional control.

Figure 42:
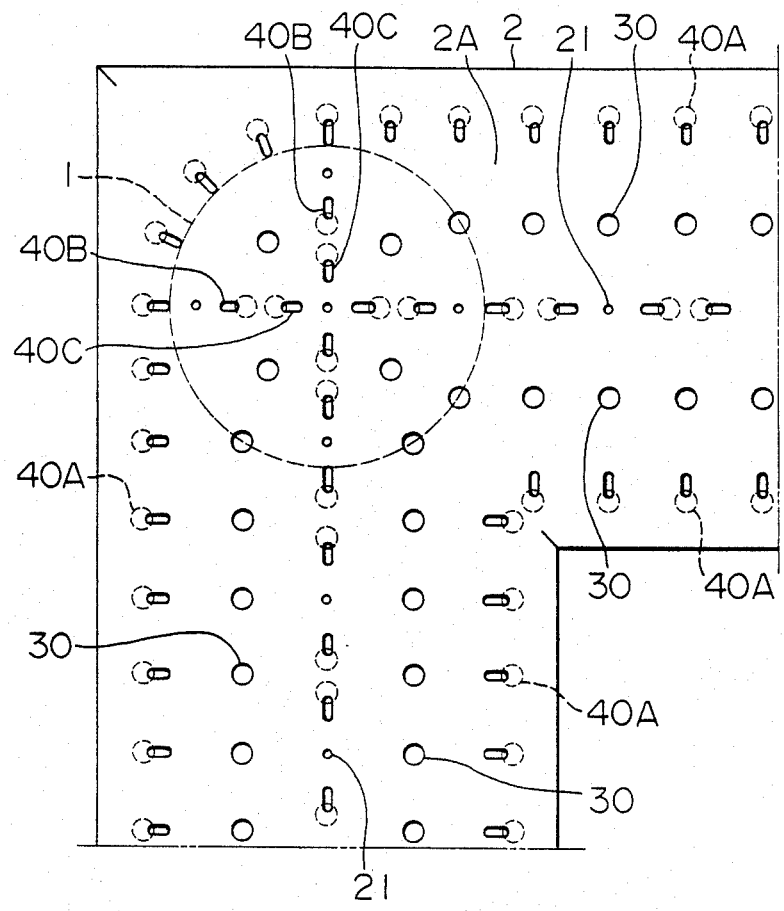
FIG. 42 is a plan view showing an apparatus in accordance with still another embodiment of the invention.

FIG. 42 shows an apparatus in accordance with another embodiment of the invention, in which the delivery path is considerably bent or curved. As described above, although the guide force of the guide mechanism constituted by the gas fluid force is relatively small, it is possible to prevent the article 1 from falling down from the delivery path 2 even with the small guide force by controlling the delivery speed so that the speed deceleration before the bent portion is started and the article 1 is once stopped at the position shown in FIG. 42. Thus, it is possible to form the curved path by using the non-contact guide mechanism using the fluid force. It is therefore possible to pass the article 1 along the curved path in the non-contact manner without any collision or shock.

Figure 43:
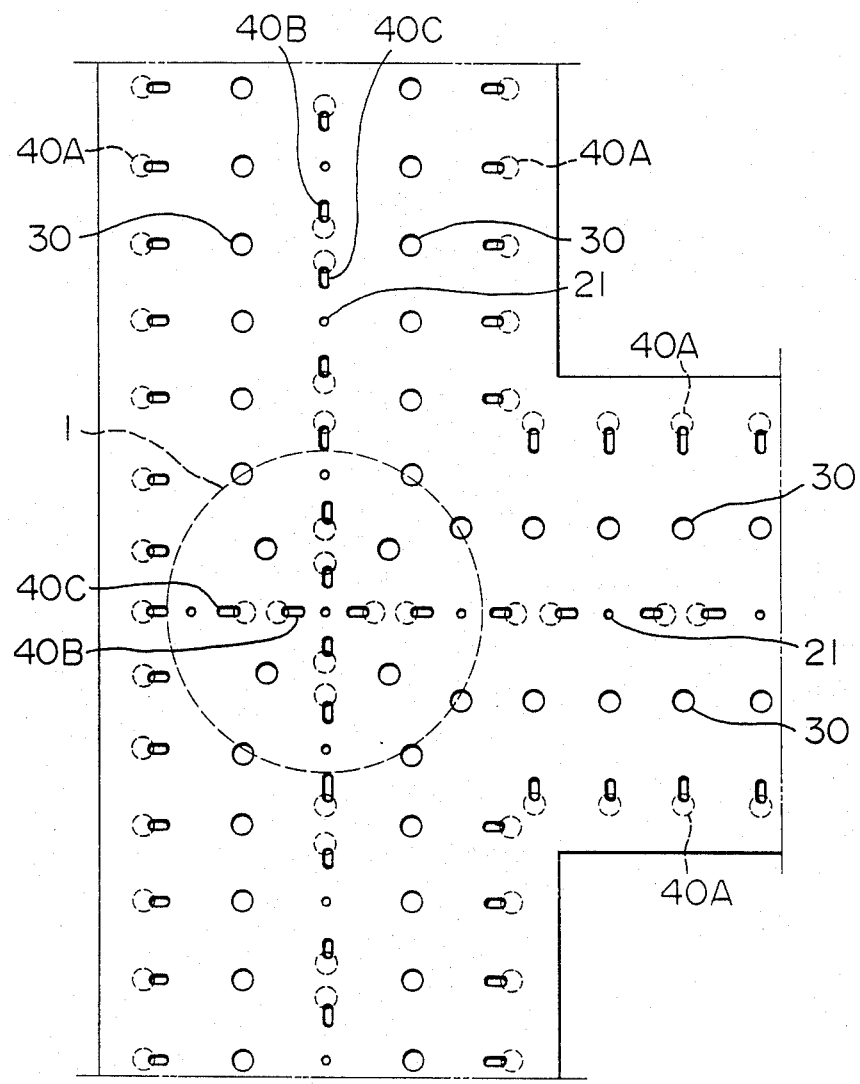
FIG. 43 is a plan view showing an apparatus in accordance with a further embodiment of the invention.

FIG. 43 shows an apparatus in accordance with another embodiment of the invention in which the delivery path has a branched path. Also in this case, it is possible to control the delivery speed so that the article 1 is stopped at the position shown in FIG. 43 and then to perform the drive force in the branch direction. In this case, the article may of course be delivered in the non-contact condition without any collision or shock.

Figure 44:
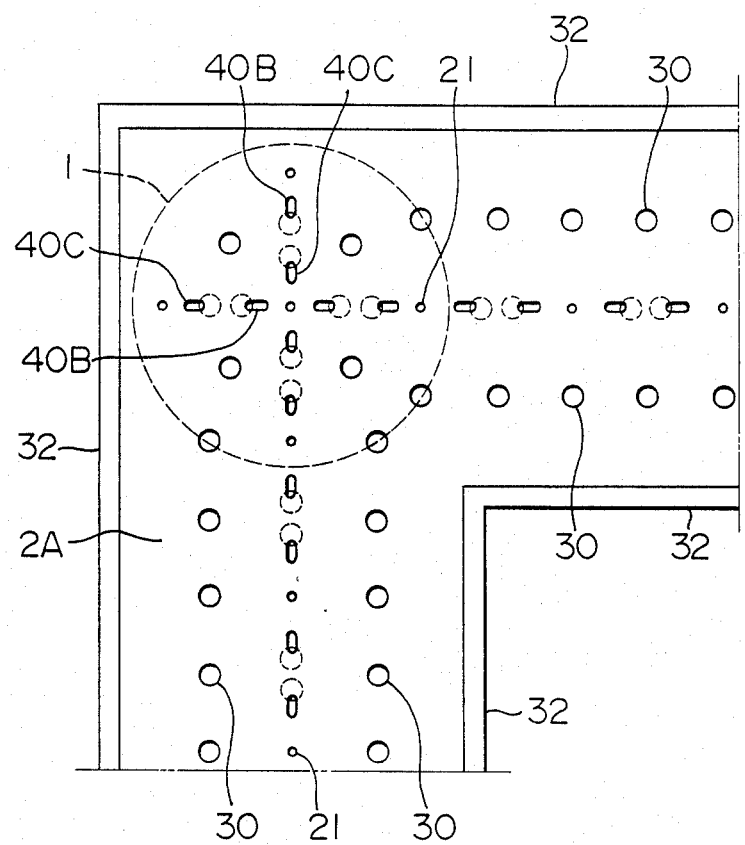
FIG. 44 is a plan view showing an apparatus in accordance with a still further embodiment of the invention.

In the embodiment of FIG. 44, instead of the drive effect gas injection portion 40A constituting the guide mechanism used in the embodiments shown in FIGS. 37 to 43, there are provided stationary wall guides 32 in, for example, the curved path.

In the case where the stationary wall guides are used, in the conventional apparatus, the article 1 would strongly collide against the guide walls in the advance direction at the curved portion so that the article 1 would be subjected to a large collision shock. However, in the embodiment of the invention in FIG. 44, the delivery speed is controlled so that the article 1 is once stopped at the position shown in FIG. 44, so that the article 1 is not subjected to any collision shock passing through the curved portion.

In the embodiment of FIG. 44, since the stationary wall guides 32 are provided, even if the large external forces are applied to the article 1, the article 1 may be prevented from falling from the delivery surface.

Figure 45:
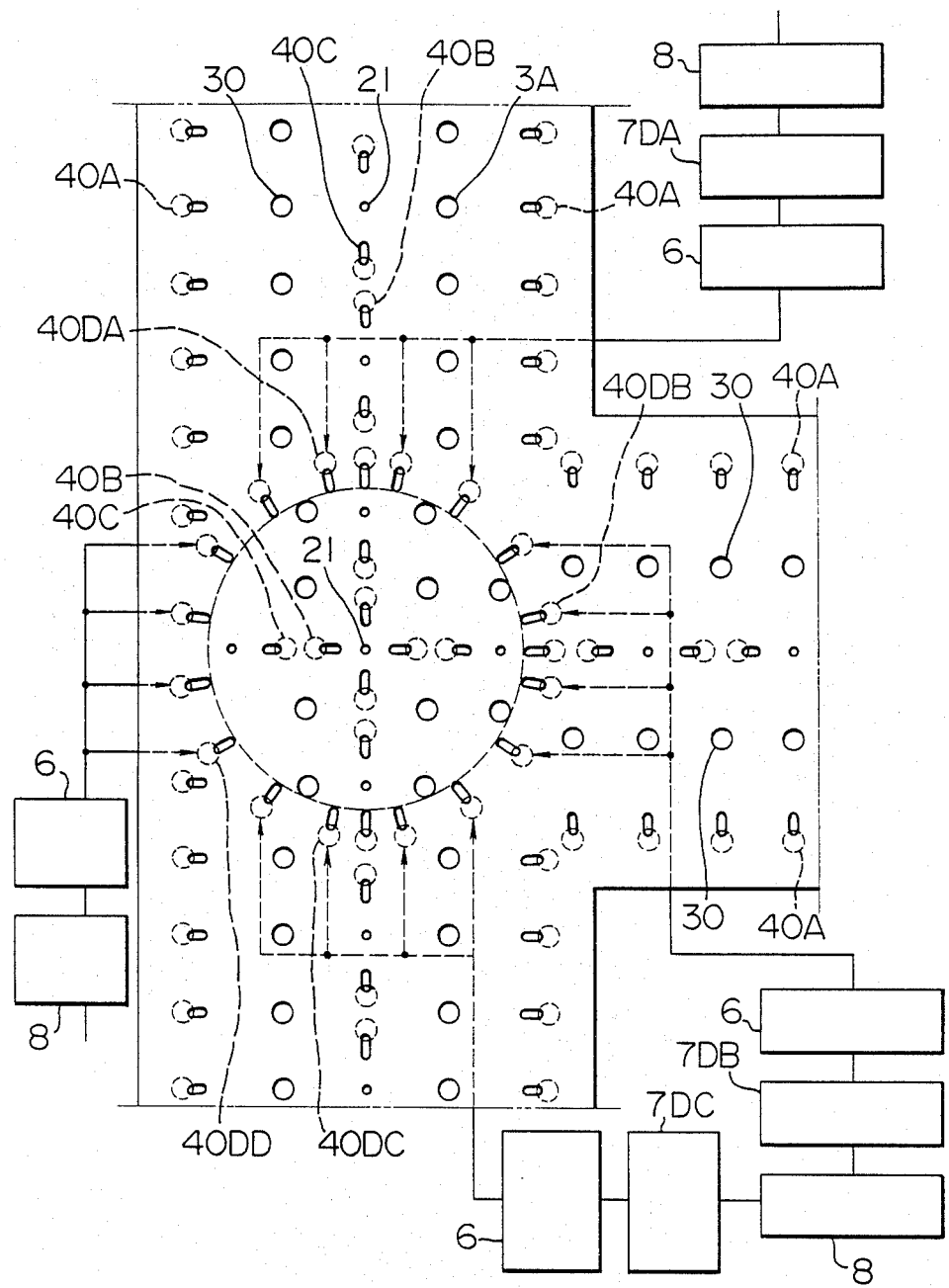
FIG. 45 is a plan view showing an apparatus in accordance with another embodiment of the invention.

In the embodiment of FIG. 45, there is provided a holding portion for holding the article 1 in the floating or lifting condition above the delivery surface 2A at a branched point of the branched path (as shown in FIG. 43). The holding portion is composed a plurality of drive effect gas injection portions 40DA to 40DD disposed in four groups in the delivery surface 2A in the vicinity of lower peripheral portions of the article 1 floated above the branched point of the delivery surface, that is, the article located in a shown position, so that the drive forces each have components directed to a central portion of the lower surface of the article held in the shown position. Pressurized gas is supplied through valve units 7DA, 7DB and 7DC into the drive effect gas injection portions 40DA, 40DB and 40DC, respectively, and the pressurized gas is directly supplied to the drive gas injection portions 40DD without interposing the valve unit.

The operation of holding the article 1 by the gas injection portions 40DA to 40DD will first be explained. Assume that the pressurized gas is supplied to all the drive effect gas injection portions 40DA to 40DD, and the article 1 to be delivered is located in the central portion of a loop of the drive gas injection portion, i.e., at the position shown in FIG. 45. When the article 1 has been shifted from the position shown in FIG. 45 with its lower edge portion being located above the drive effect gas injection portions 40DA to 40DD provided in the offset position, the drive forces in the direction opposite the offset position are applied to the article 1. As a result, the article 1 is immediately moved to the position shown. Next, the branch delivery operation will be explained. For example, the article 1 is introduced into the branched portion from the lower side in FIG. 45 and is delivered to the right. Under the condition that the valve units 7DA and 7DB are opened and the valve unit 7DC is closed, that is, the pressurized gas is supplied to the drive gas injection portions 40DA, 40DB and 40DD, whereas, the pressurized gas is not supplied to the drive gas injection portions 40DD located in the inlet path, awaiting the approach of the article 1. Then, the delivery speed is controlled so that when the article 1 comes before the branched portion, the deceleration of the article 1 is started and the article is stopped at the position shown. After it has been detected by the photoelectric switches 21 that the article 1 has reached the branched portion, the valve unit 7DC that has been closed is opened. Thus, the article 1 is held above the branched portion. Thereafter, the supply of the pressurized gas to the gas injection portion 40DB is stopped, and the pressurized gas is applied to the drive effect gas injection portions 40DD for applying the drive forces in a direction away from the branched portion, whereby the article 1 is separated from the branched portion to perform the branch operation.

In the embodiment of FIG. 45, since the holding portion for holding the article 1 above the branched portion is provided in the delivery path, it is possible to hold above the branched portion without fail even if there would be an error in controlling the delivery speed for stopping the moving article 1 above the branch portion Also, there are no fears or risks that the article 1 would enter an undesired branched path or would be stopped before the branched portion to fail to reach the branched portion.

Also, in the embodiment of FIG. 45, the branched path is shown; however; by removing one of the two delivery paths 2 extending from up and down from the branched portion in FIG. 43, it is easy to form the bent or curved path. Also, by removing two of the three delivery paths extending from the branched portion, it is possible to form the stop portion corresponding to that shown in FIG. 1. Also in these bent or curved paths and stop portion, even if there is an error in controlling the delivery speed, it is possible to positively pass the article 1 along the bent or curved paths and to positively stop the article 1 above the stop portion. At the stop portion, it is possible to hold the article 1 in the completely non-contact condition. It is therefore possible to convey the article 1 over all the portions including the stop portions, bent portions and decomposition portions.

As described above, according to the present invention, since it is possible to convey the articles in the non-contact condition without any shock, including the operations of the stop after movement, the passage above the bent paths and the branch delivery, it is possible to protect the articles from dust or damage, and it is possible to deliver the article in the clean condition.

The foregoing embodiments are related to the article conveying apparatus. The apparatus for holding the article is described hereunder.

Figure 46:
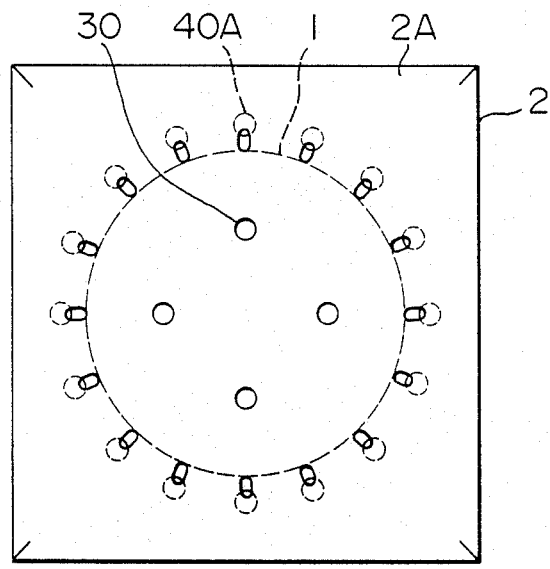
FIG. 46 is a plan view showing one embodiment of a holding device according to the invention.

FIG. 46 shows an embodiment of a holding apparatus of the invention. In this embodiment, in the holding surface of a holder 2, there are provided a plurality of floating gas injection portions 30 for effecting only the lifting forces in a direction perpendicular to the holding surface 2A to the article 1, and a plurality of drive gas injection portions 40A for effecting drive forces in a- direction parallel to the holding surface 2A as well as the lifting forces to a peripheral portion of the article 1 to be held.

In this arrangement, the lifting effect gas injection portions 30 are adapted to discharge gas at a low injection velocity to apply the lifting forces to the holding surface 2A in the vertical direction. Also, the drive effect gas injection portions 40A are adapted to discharge gas at a low injection velocity to apply the gas toward the center of the article 1 to be held and to suppress the movement of the article 1 in parallel with the holding surface 2A. Thus, it is possible to hold the article in a condition wherein the surface thereof is free from dust.

In the embodiment of FIG. 47, the drive effect gas injection portions 40A are arranged in an annular fashion in the holding surface 2A in the vicinity of the lower peripheral portion of the article 1 under the condition that the drive forces have components directed toward the central portion of the article 1.

In the case where the article 1 is located in a position shown, the drive forces applied to the article 1 are balanced by the drive gas injection portions 40A but no forces in parallel with the holder surface 2A is applied to the article 1. However, when the article 1 is shifted from the position shown, the drive effect gas injection portions 40A located opposite to the shift direction are out of the lower surface of the article 1. As a result, the forces directed toward the central portion of the holding surface 2A are applied to the article 1 so that article 1 is immediately returned back to the central position.

In the embodiment of FIG. 47, since the article 1 is floatingly held solely by the drive gas injection portions 40A, it is possible to hold the article 1 in the completely non-contact condition with a relatively simple structure.

In the embodiment of FIG. 48, lifting effect gas injection portions 30 are arranged in an annular fashion in the holding surface 2A in the vicinity of the lower peripheral portion of the article 1, and similarly the lifting effect gas injection portions 30 are arranged in the portion, covered by the article 1, of the article 1.

When the article 1 is shifted from the position shown, the edge surface, on the shifted side, of the lower surface of the article 1 is lifted, returning forces toward the central portion of the holding surface 2A are applied to the article 1.

In the embodiment, since the article 1 is floatingly supported solely by the floating effect gas injection portions 30, it is possible to hold the article in the completely non-contact state with a relatively simple structure.

In the embodiment of FIGS. 49 and 50, floating effect gas injection portions 30 are formed in the holding surface 2A, and the holding surface 2A is formed so as to be concave downwardly.

In the case where the article 1 is shifted from the position shown, the article 1 is moved along the holding surface 2A curved concavely. Therefore, the returning forces toward the central portion of the holding surface are applied to the article 1 by the gravitational force and the effect of the floating effect gas injection portions around its peripheral portions.

In the embodiment of FIGS. 49 and 50, since the gravitational force on the basis of the shape of the holding surface 2A formed in the concave manner is utilized as the returning force, it is possible to positively hold the article 1 in the non-contact condition.

Figure 51:
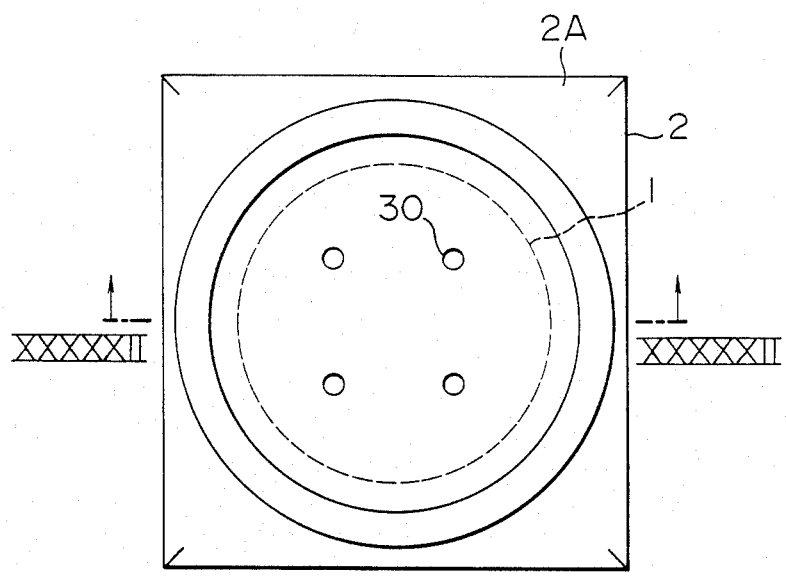
FIG. 51 is a plan view showing another embodiment of a holding device according to the invention.
Figure 52:
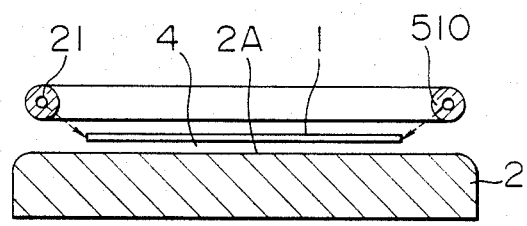
FIG. 52 is a cross-sectional view taken along the line XXXXXII—XXXXXII of FIG. 51.

In the embodiment of FIGS. 51 and 52, lifting effect gas injection portions 30 are formed in the holding surface 2A, and at the same time, in order to keep the article 1 in the central portion of the holding surface 2A, small holes 510 for injection downward jet flows against the peripheral portion of the article 1 are arranged around the periphery of the article 1 to be held.

In this embodiment, since the means for holding the article 1 at the central portion of the apparatus under the non-contact condition is composed of the small holes 510 for injecting the jet flows, it is easy to work or manufacture the apparatus. It should be noted that the downward jet flows are effective to prevent the dust entrainment or turbulence of the down flows in comparison with the upward jet flows.

Figure 53:
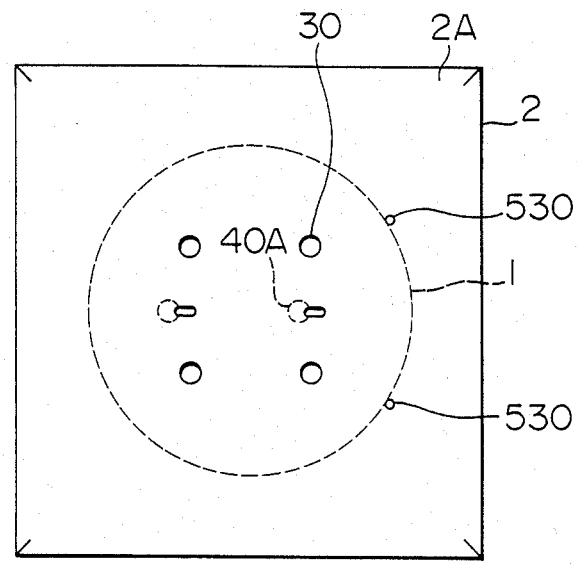
FIG. 53 is a plan view showing still another embodiment of a holding device according to the invention.
Figure 54:
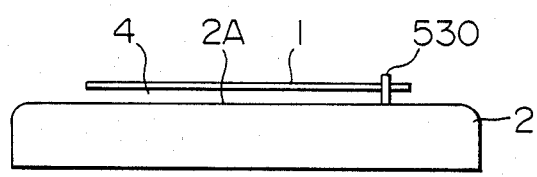
FIG. 54 is a frontal view of the device shown in FIG. 53.

In the embodiment of FIGS. 53 and 54, lifting effect gas injection portions 30 are formed in the holding surface 2A, in order to hold the article 1 in the central portion of the holding surface 2A, positioning members 530 in contact with parts of the article 1 are provided, and drive gas injection portions 40A are provided for depressing the positioning members 530 against the article 1 to be held.

In this embodiment, since the article 1 is held in a stationary condition in contact with the positioning members 530, it is possible to hold the article 1 in a positive manner and to position the article with high accuracy.

In the foregoing embodiments, the gas injection may be replaced by the fluid injection.

As has been described above, according to the various embodiments of the invention, the entrainment of the dust or down flow turbulence may be avoided. It is, therefore, possible to keep under the clean condition the articles that should be kept clean.

We claim:

1. In a conveyor apparatus in which a fluid film is formed between a delivery surface of a delivery path and an article to be conveyed, and said article is conveyed in a non-contact condition relative to said delivery surface by said fluid film, an improvement comprising fluid injection means provided in said delivery surface for supplying fluid at a low flow velocity to form said fluid film between said delivery surface and said article, said fluid injection means being formed in said delivery surface, said fluid injection means includes a pressurized fluid supplying portion, a resistance portion for applying a resistance to pressurized fluid from said pressurized fluid supplying portion, a suppressing portion for suppressing the fluid from said resistance portion, and an opening for allowing a flow velocity of the fluid from said suppressing portion to flow toward the article with its resistance being smaller than a resistance of said resistance portion.

2. A conveying apparatus according the claim 1, wherein said suppressing portion includes a first suppressing means for suppressing a high flow velocity of said pressurized fluid, and a second suppressing means for further suppressing a flow velocity of the fluid from said first suppressing means.

3. In a conveying apparatus in which a fluid film is formed between a delivery surface of a delivery path and an article to be conveyed, and said article is conveyed in a non-contract condition relative to said delivery surface by said fluid film, the improvement comprising fluid injection means provided in said delivery surface for supplying fluid at a low velocity to form said fluid film between said delivery surface and said article, said fluid injection means being formed in said delivery surface, said fluid injection means includes a pressurized includes a pressurized fluid supply passage, a resistance suppressing portion for giving a resistance to pressurized fluid from said pressurized fluid supply passage and for suppressing a flow velocity of the pressurized fluid, and an opening portion for allowing the fluid from said resistance suppressing portion to flow toward said article, said opening portion having a resistance smaller than a resistance of said resistance suppressing portion.

4. In a conveyor apparatus in which a fluid film is formed between a delivery surface of a delivery path and an article to be conveyed, and said article is conveyed in a non-contact condition relative to said delivery surface by said fluid film, the improvement comprising: fluid injection means provided in said delivery surface for supplying fluid at a low flow rate to form said fluid film between said delivery surface and article, said fluid injection means being formed in said delivery surface; a pressurized fluid supply source connected to said fluid injection means for supplying pressurized fluid to said fluid injection means; flow rate adjusting means disclosed between said pressurized fluid supply source and said fluid injection means for adjusting a flow rate; detecting means for detecting a position of said article to be conveyed; and controlling means for controlling said flow rate adjusting means in accordance with signal supplied from said detecting means; said fluid injecting means includes a pressurized fluid supplying portion, a resistance portion for applying a resistance to pressurized fluid from said pressurized fluid supplying portion, a suppression portion for suppressing a flow velocity of the fluid from said resistance portion, and an opening portion for allowing the fluid from said suppressing portion to flow toward the article with its resistance being smaller than a resistance of said resistance portion.

5. The conveying apparatus according to claims 4, wherein said fluid injection means includes a first fluid injection portion for applying a drive force to the article in one direction and a second fluid injection portion for applying a drive force to the article in another direction.

6. The conveying apparatus according to claims 4, wherein said first suppressing portion includes a first suppressing means for suppressing a high flow velocity of said pressurized fluid from the resistance portion, and a second suppressing means for further suppressing a flow velocity of the fluid from said first suppressing means.

7. In a conveying apparatus in which a fluid film is formed between a delivery surface of a delivery path and an article to be conveyed, and said article is conveyed in a non-contact condition relative to said delivery surface by said fluid film, the improvement comprising: fluid injection means provided in said delivery surface for supplying fluid at a low flow rate to form said fluid film between said delivery surface and said article, said fluid injection means being formed in said delivery surface; a pressurized fluid supply source connected to said fluid injection means for supplying pressurized fluid to said fluid injection means; flow rate adjusting means disposed between said pressurized fluid supply source and said fluid injection means for adjusting a flow rate; detecting means for detecting a position of said article to be conveyed; and controlling means for controlling said flow rate adjusting means in accordance with signal supplied from said detecting means; of said fluid injection means includes a pressurized fluid supply passage, a resistance suppressing portion for giving a resistance to pressurized fluid from said pressurized fluid supply passage and for suppressing a flow velocity of the pressurized fluid, and an opening portion for allowing the fluid from said resistance suppressing portion to flow toward said article, said opening portion having a resistance smaller than a resistance of said resistance suppressing portion.

8. The conveying apparatus according to claim 7, wherein said fluid injection means includes a first fluid injection portion for applying a drive force to the article in one direction and a second fluid injection portion for applying a drive force to the article in another direction.

9. In a holding apparatus in which a gas lubrication film is formed between a holding surface and an article to be held by gas injected from gas injection means provided from said holding surface, and said article is held in a non-contact condition relative to said holding surface of said gas lubrication film, the improvement comprising fluid injection means provided in said holding surface for supplying fluid at a low flow velocity to form a fluid film between holding surface and said article, said fluid injection means includes a pressurized fluid supplying portion, a resistance portion for applying a resistance to pressurized fluid from said pressurized fluid supplying portion, a suppressing portion for suppressing a flow velocity of the fluid from said resistance portion, and an opening portion for allowing the fluid from said suppressing portion to flow toward the article with its resistance being smaller than a resistance of said resistance portion.

10. In a holding apparatus in which a gas lubrication film is formed between a holding surface and an article to be held by gas injected from gas injection means provided in said holding surface, and said article is held in a non-contract condition relative to said holding surface of said gas lubrication film, the improvement comprising fluid injection means provided in said holding surface for supplying fluid at a low flow velocity to form a fluid film between said holding surface and said article, said fluid injection means includes a pressurized fluid supply passage, a resistance suppressing portion for giving a resistance to pressurized fluid from said pressurized fluid supply passage and for suppressing a flow velocity of the pressurized fluid, and an opening portion for allowing the fluid from said resistance suppressing portion to flow toward said article, said opening portion having a resistance smaller than an resistance of said resistance suppressing portion.

* * * * *